(12) United States Patent
Setayesh et al.

(10) Patent No.: US 8,241,946 B2
(45) Date of Patent: Aug. 14, 2012

(54) METHOD OF FORMING AN ORGANIC SEMICONDUCTING DEVICE BY A MELT TECHNIQUE

(75) Inventors: Sepas Setayesh, Eindhoven (NL); Dagobert M. de Leeuw, Eersel (NL); Natalie Stutzmann-Stingelin, Eindhoven (NL)

(73) Assignee: Creator Technology B.V., Breda (NL)

( * ) Notice: Subject to any disclaimer, the term of this patent is extended or adjusted under 35 U.S.C. 154(b) by 656 days.

(21) Appl. No.: 11/568,192

(22) PCT Filed: Apr. 22, 2005

(86) PCT No.: PCT/IB2005/051330
§ 371 (c)(1),
(2), (4) Date: Oct. 23, 2006

(87) PCT Pub. No.: WO2005/104265
PCT Pub. Date: Nov. 3, 2005

(65) Prior Publication Data
US 2008/0254568 A1    Oct. 16, 2008

Related U.S. Application Data

(60) Provisional application No. 60/565,764, filed on Apr. 27, 2004.

(51) Int. Cl.
  *H01L 51/40* (2006.01)
  *H01L 51/05* (2006.01)
  *H01L 29/08* (2006.01)
(52) U.S. Cl. .... 438/99; 438/780; 438/781; 257/E51.003
(58) Field of Classification Search .................. 438/99, 438/780, 781; 257/E51.003
See application file for complete search history.

(56) References Cited

U.S. PATENT DOCUMENTS

| 5,912,473 | A | 6/1999 | Wakita et al. |
| 6,180,956 | B1 | 1/2001 | Chondroudis et al. |
| 6,403,397 | B1 * | 6/2002 | Katz ............................... 438/99 |
| 6,517,995 | B1 * | 2/2003 | Jacobson et al. .............. 430/320 |
| 6,784,017 | B2 * | 8/2004 | Yang et al. ...................... 438/99 |
| 7,095,044 | B2 * | 8/2006 | Brown et al. ................... 257/40 |
| 7,718,734 | B2 * | 5/2010 | Veres et al. ..................... 525/88 |
| 2003/0085398 | A1 | 5/2003 | Koyama et al. |
| 2003/0170918 | A1 | 9/2003 | Dehaven et al. |
| 2003/0190235 | A1 | 10/2003 | Subramanian |
| 2004/0033641 | A1 | 2/2004 | Yang et al. |
| 2007/0048637 | A1 * | 3/2007 | Okada et al. .............. 430/58.75 |
| 2008/0171403 | A1 * | 7/2008 | Masumoto et al. ............. 438/99 |

FOREIGN PATENT DOCUMENTS

| EP | 0442123 | 8/1991 |
| EP | 1081774 | 3/2001 |
| EP | 1405893 | 4/2004 |
| JP | 11195790 | 7/1999 |

(Continued)

*Primary Examiner* — Thao Le
*Assistant Examiner* — Ron Pompey

(57) ABSTRACT

The present invention provides a method of forming a semiconducting device comprising an organic semiconducting material, which method comprises: heating a composition comprising the organic semiconducting material to a temperature at or above the melting point or glass transition temperature of the composition to form a melt; cooling the melt to a temperature below the melting point or glass transition temperature of the composition; and wherein a first substance or object capable of inhibiting and/or preventing dewetting is adjacent the composition before or during heating, or the composition further comprises an agent capable of inhibiting and/or preventing dewetting.

39 Claims, 6 Drawing Sheets

FOREIGN PATENT DOCUMENTS

| | | |
|---|---|---|
| JP | 2002-222970 | 8/2002 |
| JP | 2003-258265 | 9/2003 |
| JP | 2003-282883 | 10/2003 |
| JP | 2004-15062 | 1/2004 |
| WO | WO 2004/023560 A1 | 3/2004 |

* cited by examiner

METHOD OF FORMING AN ORGANIC SEMICONDUCTING DEVICE BY A MELT TECHNIQUE

CROSS REFERENCE TO RELATED CASES

Applicants claim the benefit of U.S. Provisional Application Ser. No. 60/565,764, filed Apr. 27, 2004 and International Application No. PCT/IB2005/051330, filed Apr. 22, 2005.

The present invention relates to a method of forming a device, such as a field-effect transistor, comprising organic semiconductor material, the device obtainable according to the method, compositions for forming a device and the uses of certain compounds.

The fabrication of the first organic field-effect transistor (FET) utilizing a specific conducting polymer as a semiconductor was described by Tsumura, et al. (*Appl. Phys. Lett.* 1986, 49, pp 1210-1212). In Tsumura et al, the conducting polymer is a polythiophene film electrochemically prepared under a nitrogen atmosphere using 2,2'-bithiophene, a dimer of thiophene, as a starting material.

Nelson et al (*Appl. Phys. Lett.* 1998, 72, pp 1854-1856) describe pentacene thin film devices that have a room-temperature field-effect mobility ranging from 0.3 to over 1.5 $cm^2$/Vs. In Nelson et al, the pentacene is deposited by thermal evaporation at pressures below $10^{-6}$ Torr. The substrate, a heavily doped thermally oxidised silicon wafer, was treated with octadecyltrichlorosilane (a self-organizing material) and held at temperatures of between 60 and 90° C. during the depositions.

However, vacuum deposition, as described in Nelson et al, is time-consuming and difficult and therefore too expensive to compete with amorphous silicon transistor technology.

Sirringhaus et al (Science, 1998, 280, pp 1741-1744) discloses the use of a solution-processed polymer, regioregular poly(hexylthiophene), in an FET which can exhibit vacuum charge-carrier mobilities of up to 0.05 to 0.1 $cm^2$/Vs. However, these polymers are often prone to, for example, unintentional doping.

Sirringhaus et al (Applied Physics Letters, Volume 77, Number 3, 17 July 2000) describes a method by which liquid-crystalline self-organization in specified rigid-rod nematic conjugated polymers can be used to control the microstructure of the active semiconducting layer in solution-processed polymer thin-film transistors (TFTs).

Melucci et al (J. Am. Chem. Soc. 2003, 125, 10266-10274) discloses the multiscale self-organization of the organic semiconductor α-quinquethiophene.

US 2003/0170918 A1 describes the low temperature melt-processing of organic-inorganic hybrid materials, particularly materials of the perovskite family. US 2003/0160235 A1 and US 2003/0085398 A1 disclose specific organic semiconductor devices.

Podzorov et al. (*Appl. Phys. Lett.* 2003, 82, pp 1739-1741) describes the fabrication and characterization of organic field-effect transistors (OFETs) on the surface of single crystals of rubrene having a parylene polymer film as a gate insulator. The OFETs containing the combination of a rubrene single crystal and a parylene film have been found to display high charge-carrier mobilities of up to about 1 $cm^2$/Vs. Podzorov et al discloses the use of physical vapour transport in hydrogen under specific conditions for the growth of suitable single crystals of rubrene. The requirement for single crystals and their difficulty of preparation could, however, limit the technological exploitation of such OFETs.

There remains a need for organic materials suitable for use in field-effect transistors that may display good processability and/or high charge-carrier mobilities that may also be accompanied by a high gate modulation and/or environmental stability and that may also be prepared conveniently.

The present invention is also concerned with addressing the problem of dewetting when applying thin film structures onto substrates.

Accordingly, it is an object of the present invention to provide a method of preparing devices comprising organic semiconductor materials which could be exploited in a variety of applications including, for example, flat panel displays, non-linear optical/photoconductive devices, chemical sensors, emitting and charge transporting layers in organic light emitting diodes, organic thin film transistors and particularly in organic field-effect transistors.

In a first aspect, the present invention provides a method of forming a semiconducting device comprising an organic semiconducting material, which method comprises: heating a composition comprising the organic semiconducting material to a temperature at or above the melting point or glass transition temperature of the composition to form a melt; cooling the melt to a temperature below the melting point or glass transition temperature of the composition; and wherein a first substance or object capable of inhibiting and/or preventing dewetting is adjacent the composition before or during heating, or the composition further comprises an agent capable of inhibiting and/or preventing dewetting.

In a second aspect, the present invention provides a method of forming a semiconducting device comprising an organic semiconducting material, which method comprises: heating a composition comprising the organic semiconducting material to a temperature at or above the melting point or glass transition temperature of the composition to form a melt; cooling the melt to a temperature below the melting point or glass transition temperature of the composition; and wherein the composition comprises a second substance that is capable of preventing initial crystallisation of the composition. The second substance may also be capable of reducing the melting point of the composition below the melting point of the semiconducting material.

In a third aspect, the present invention provides a method of forming a semiconducting device comprising an organic semiconducting material, which method comprises: heating a composition comprising the organic semiconducting material to a temperature at or above the melting point or glass transition temperature of the composition to form a melt; cooling the melt to a temperature below the melting point or glass transition temperature of the composition; and wherein the composition comprises a third substance that reduces the melting point of the composition below the melting point of the semiconducting material.

In a fourth aspect, the present invention provides a method of forming a semiconducting device comprising an organic semiconducting material, which method comprises: preparing a solution of a composition comprising the organic semiconducting material in a solvent wherein the composition further comprises an agent capable of inhibiting and/or preventing dewetting.

In a fifth aspect, the present invention provides a device comprising an organic semiconducting material obtainable by a method of the present invention.

In a sixth aspect, the present invention a method of forming a field-effect transistor comprising: forming an assembly comprising a first electrode, an insulator, a second set of electrodes and optionally a substrate; placing a composition comprising an organic semiconducting material onto the assembly; heating the assembly and/or composition comprising the organic semiconducting material to a temperature at or above the melting point or glass transition temperature of the composition to form a melt; cooling the melt to a temperature below the melting point or glass transition temperature of the composition; and wherein a first substance or object capable of inhibiting and/or preventing dewetting is adjacent the composition before or during heating, or the composition further comprises an agent capable of inhibiting and/or preventing dewetting.

In a further aspect, the present invention provides a composition for forming a semiconducting device comprising: an organic semiconducting material and an agent capable of inhibiting and/or preventing dewetting.

In a yet further aspect, the present invention provides a composition for forming a semiconductor device comprising: an organic semiconducting material and a second substance that is capable of preventing initial crystallisation of the composition. The second substance may also be capable of reducing the melting point or glass transition temperature of the composition below the melting point or the glass transition temperature of the semiconducting material.

In another aspect the present invention provides a composition for forming a semiconductor device comprising: an organic semiconducting material and a third substance that reduces the melting point or glass transition temperature of the composition below the melting point or glass transition temperature of the semiconducting material.

In a still further aspect, the present invention provides the use of a polymer in a composition to inhibit and/or prevent dewetting of the composition.

In an even further aspect, the present invention provides the use of an organic semiconducting material to prevent the initial crystallisation of a composition.

Preferred embodiments of the present invention are illustrated in the accompanying drawings in which.

Figures 3A, 3B, 3C, 3D:
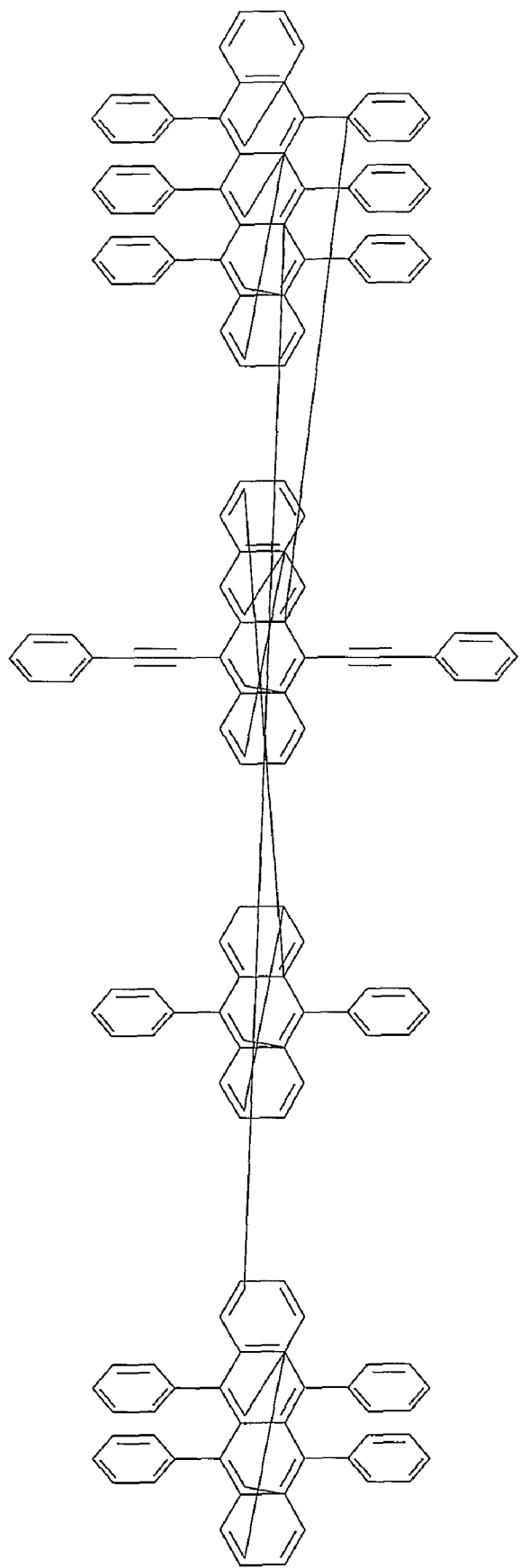

FIG. 3 shows the structure of rubrene 1a, diphenylanthracene 2a, 5,12-bis(phenylethynyl)naphthacene 3a and hexaphenylpentacene 4a.

Figure 4:
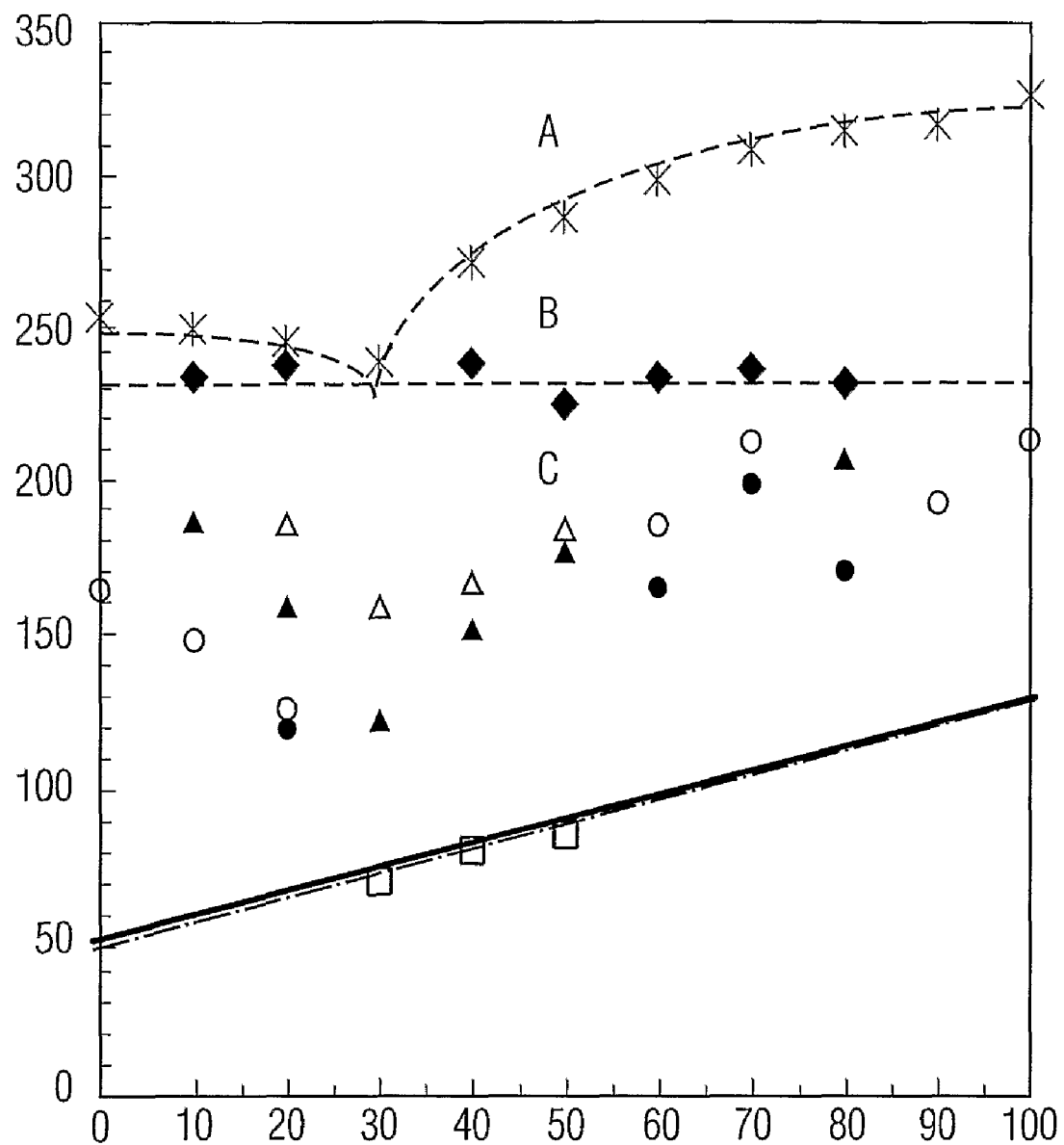

FIG. 4 shows a phase diagram of rubrene and diphenylanthracene based on differential scanning calorimetry measurements, which illustrates (i) that diphenylanthracene reduces the melting temperature of rubrene and (ii) that at certain compositions a glass is obtained (no recrystallisation is observed upon cooling a melt). In FIG. 4, the solid black triangles indicate re-crystallisation peaks upon cooling and the hollow circles indicate re-crystallisation peaks upon a second heating cycle.

Figure 5A:
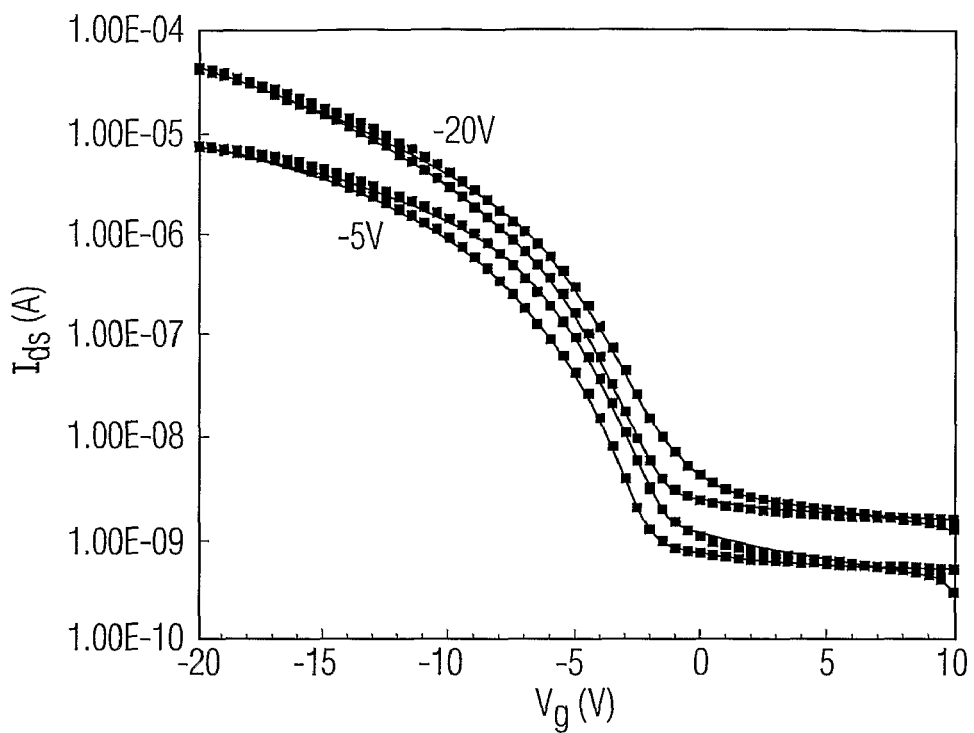
Figure 5B:
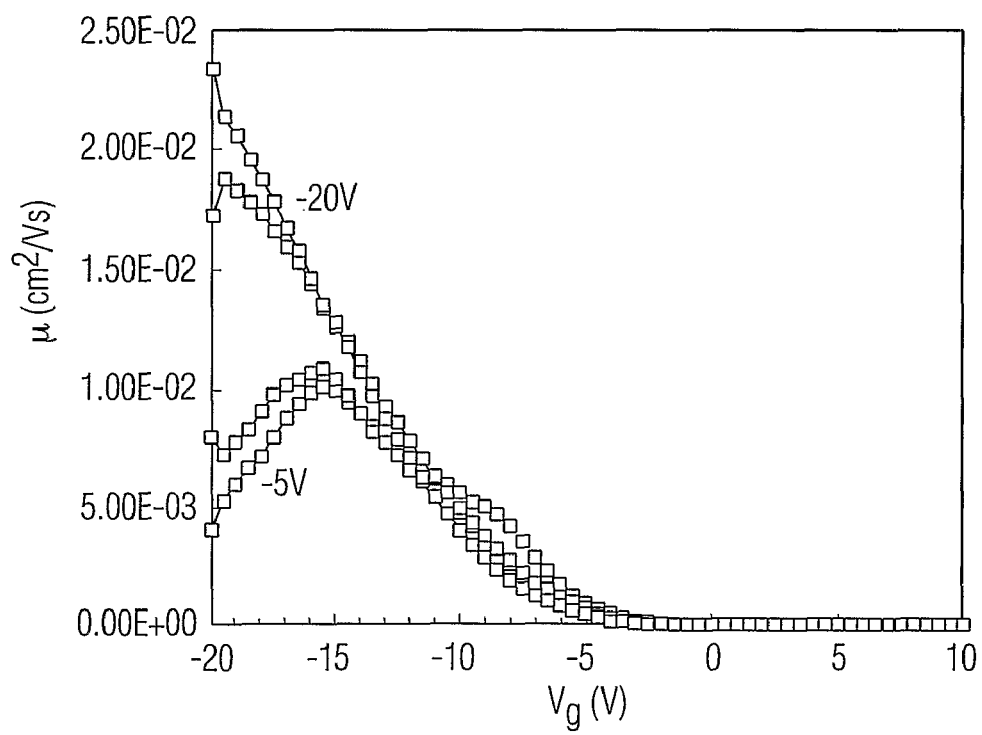
Figure 6:
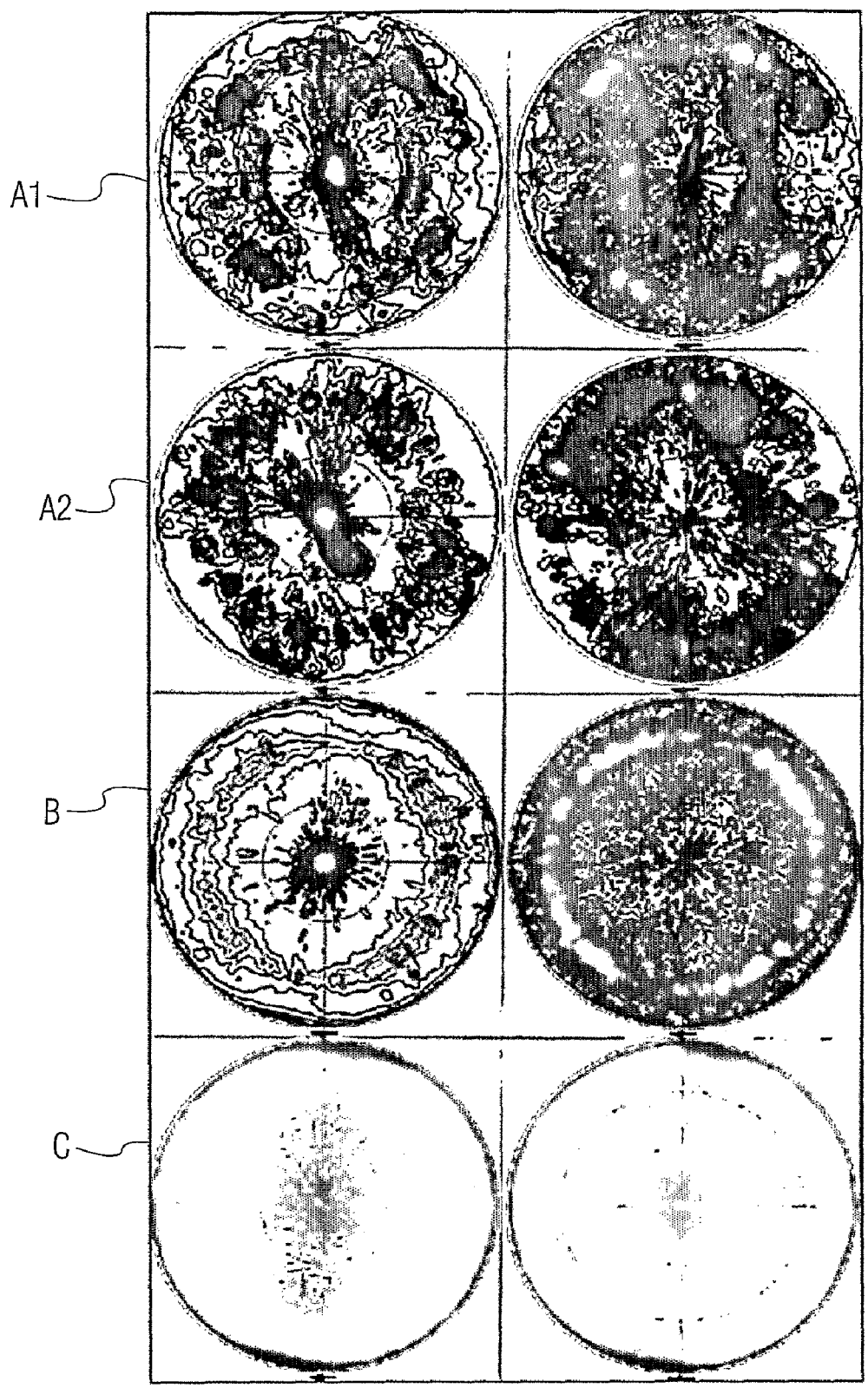

FIG. 5 shows in graphical form the drain current ($I_{ds}$) against gate voltage ($V_g$) (ON-OFF ratios) for varying drain source voltages ($V_{ds}$) and the mobility against gate voltage ($V_g$) of an FET comprising a film prepared according to a preferred embodiment of the present invention. The measurements were made on an FET as 6 fabricated in air and light; and FIG. 6 shows X-ray diffraction data of various rubrene (A1 and A2) and rubrene/diphenylanthracene/polystyrene (PS) films (B and C) fabricated at temperatures indicated in the phase diagram shown in FIG. 4.

Heating the composition to form a melt, according to the invention, includes the processes of, for example, molding and melt-pressing but also melt-spinning, melt-dipping, extruding, capillary filling and roll-to-roll processing.

The term "melt" as used herein includes compositions that are wholly liquid as well as those that are partially liquid and can flow. Thus, the melt may include solid particles or non-fully molten or undissolved material. The term "melting point" or "glass transition temperature", the latter being applicable for amorphous substances, is defined accordingly, such that it refers to the temperature at which the composition becomes at least partly liquid.

The term "semiconducting device" as used herein refers to a conductor made with semiconducting material and includes, for example, a semiconductor unit, a conductor, a microchip, a crystal rectifier, a junction rectifier, a semiconductor diode, solar cells, an n-type semiconductor, a p-type semiconductor, a thermal resistor or thermistor, and a transistor, including an electronic, field-effect, thin-film field-effect or junction transistor, logic gates such as inverters, ring oscillators and integrated circuits such as shift registers.

The term "semiconducting material" as used herein, includes a substance whose electrical conductivity is intermediate between a metal and an insulator; its conductivity increases with temperature and in the presence of impurities. Conductors generally have a resistivity below $10^{-5}$ Ωm, preferably at 25° C. and atmospheric pressure. Semiconductors generally have resistivities in the range $10^{-5}$ Ωm to $10^8$ Ωm, preferably at 25° C. and atmospheric pressure. Insulators generally have a resistivity above $10^8$ Ωm, preferably at 25° C. and atmospheric pressure.

The term "organic semiconducting material" as used herein is intended to include any organic material (i.e., containing at least carbon and a plurality of carbon-carbon single and/or double bonds and preferably also hydrogen and carbon-hydrogen bonds) that has significant semiconducting ability and which has a melting point or a glass transition temperature, i.e., a temperature at or above which it becomes a liquid/melts. The melting point or glass transition temperature can be either as a substantially pure compound or in the presence of a different compound.

In one embodiment, the organic semiconducting material may comprise semiconducting inorganic particles within, for example, a polymer which can be melted or which has a glass transition temperature.

The organic semiconducting material may be a single compound or a combination of two or more compounds. The term "compound" as used herein may include polymers. In an alternative embodiment the compound can be optionally doped according to any of the methods known in the art.

In one embodiment, the composition comprising the organic semiconducting material may also include a second organic material that does not have any significant semiconducting ability. The second organic material may be added to, for example, increase the viscosity of the composition and/or melt, or to raise its affinity to a substrate, which reduces dewetting problems. Alternatively, the second organic material could also be semiconducting.

In one embodiment, the organic semiconducting material is part of an electrically insulating organic polymer structure. Such a polymer structure is known from WO-A-03/079400. The organic semiconducting material can be embedded in such a structure as side groups in a polyvinylic polymer, as one of the monomers to form a copolymer, particularly a block copolymer, and within a polymer network, for instance in that use is made of acrylates as the network building polymer. It is noted that the insulating structure can be chosen such that the system can be processed from solution in an excellent manner. Furthermore, the matrix material of the structure offers the possibility to optimize the desired processing and electrical behaviour.

In a still further preferred embodiment, the composition is substantially free of organic-inorganic hybrid materials, such as perovskites, and those materials described in U.S. Pat. No. 6,180,956. By the term "substantially free", it is meant that the composition comprises less than 10 wt.%, preferably less than 5 wt %, more preferably, less than 1 wt. % organic-inorganic hybrid materials by weight of the total composition.

The dewetting of thin films of solid deposited on substrates can occur when applying thin-film structures. Dewetting occurs when a substance forms a sphere instead of a layer over a surface. It can also occur when an initially planar thin film forms a hole exposing an underlying substrate. See, for example U.S. Pat. No. 6,403,397.

In one embodiment, a first substance or object capable of inhibiting and/or preventing dewetting is adjacent to the composition before or during heating, preferably before heating the composition. The first substance or object may be removed after heating. In particular, the first substance or object may be removed before or after cooling the melt.

In a preferred embodiment, the first substance or object capable of inhibiting and/or preventing dewetting is in the form of a layer that is placed on top of the composition layer i.e., the surface opposite that directly in contact with the layers of a substrate or assembly. It is preferred if the substance is in the form of a film, preferably a film having a substantially smooth surface. It is particularly preferred that the object has a substantially smooth surface for contact with the composition.

The first substance or object preferably has a low affinity for the composition and/or melt. "Low affinity" as used herein is intended to mean that that there is a substantial absence of the favourable molecular interactions referred to in U.S. Pat. No. 6,403,397, such as attractive forces between dipoles (permanent, and/or induced, including those in π-conjugated systems), hydrogen bonds, and charge transfer complexation, between the moieties of the first substance or object and the moieties of the organic semiconductor material.

In a preferred embodiment, the first substance or object comprises polytetrafluoroethylene (PTFE), poly(imide) (PI), mica, silicon or mixtures thereof.

Alternatively, the composition further comprises an agent capable of inhibiting and/or preventing dewetting of the composition. The agent may be added to the composition before or after heating the composition. Preferably, the agent is added before heating the composition.

In a preferred embodiment, the agent increases the viscosity of the composition and/or melt, relative to the viscosity of the composition and/or melt without the agent, and/or increases the affinity of the composition and/or melt to a substrate, relative to the affinity of the composition and/or melt to a substrate without the agent. The agent may optionally be removed after heating, for example by sublimation, evaporation or dissolution. In particular, the agent can be removed before or after cooling the melt.

In one embodiment, the agent is a polymer, such as, for example, polystyrene. It is particularly preferred if the polystyrene has a weight average molecular weight ($M_w$) of at least about 1,000,000 g/mol, more preferably from about 2,000,000 to about 70,000,000, most preferably from about 4,0000,000 to about 35,000,000 g/mol. The agent is preferably present in the composition in an amount of 1 to 50, preferably, 2 to 20, most preferably 5 to 15 wt. % of the total composition.

In another embodiment, in the case of a composition that is capable of adopting at least a partially crystalline form, the composition comprises a second substance that is capable of preventing initial crystallisation of the composition i.e., it acts as a temporary anti-nucleation agent. Accordingly, the composition comprising the second substance may initially form, for example, a glass, which can be recrystallised in a subsequent step at a temperature, for instance, below the melting point of the composition. The recrystallisation may be triggered by, for example, a heating and cooling cycle. The second substance may, for example, be a different organic semiconducting material, as defined herein. Preferably, the second substance does not lower the mobility of the organic semiconducting material in the composition.

In a further embodiment, the composition comprises a second substance that is capable of preventing initial crystallisation of the composition and is also capable of reducing the melting point or glass transition temperature of the composition below the melting point or glass transition temperature of the semiconducting material.

The second substance may, for example, be a different organic semiconducting material, as defined herein. Examples of suitable second substances include polycyclic aromatic compounds such as diphenylanthracene, phenylnaphthalene, fluoranthene and its derivatives. The second substance may be present in the composition in an amount of at least about 0.01 wt % of the total composition, more preferably at least about 1.0 wt % of the total composition. Diphenylanthracene is particularly preferred second substance where the organic semiconducting material is rubrene.

The second substance may optionally be removed after heating, for example by sublimation, evaporation or dissolution. In particular, the second substance can be removed before or after cooling the melt.

The method of the present invention may suitably be carried out at ambient pressure, in vacuo or at low pressure, for example less than 0.1 Pa, or at pressures higher than atmospheric pressure, for example greater than $10^5$ Pa. The method of the present invention may also be carried out in the presence of an inert gas such as argon or nitrogen at a low pressure, for example a pressure less than 0.1 Pa. The gas may be optionally dried using any of the conventional techniques for drying such gases. This embodiment of the invention may be particularly appropriate if the organic semiconducting material degrades upon heating in air.

The method of the present invention may also be carried out in the substantial absence of light and this can be particularly preferred if the organic semiconducting material is sensitive to light.

In one embodiment of the present invention, the composition comprising the organic semiconducting material is heated in the presence of air and/or light. Preferably, the composition is stable on heating in air and/or on exposure to light.

By "stable", it is intended to mean that the composition does not substantially decompose on heating in air at temperatures less than 100° C., preferably less than 50° C., most preferably less than 20° C. above the melting point or glass transition temperature of the composition. This means that less than 50% wt., preferably less than 20% wt., more preferably less than 10% wt., most preferably less than 1% wt. of the composition decomposes under these conditions.

In one embodiment of the invention, the composition is heated in air and light. It is preferred that the air is at atmospheric pressure, although lower pressures, such as $10^{-6}$ Pa to 1 Pa, and pressures higher than atmospheric pressure, such as greater than $10^5$ Pa, may also be suitable.

The composition may be in any physical form that can be melted. Conveniently, the composition is in the form of, for example, particles that form a powder or granules at a temperature of, for example, from 10° C. to 40° C. Preferably, the composition is in the form of a powder prior to heating. More preferably, the composition is in the form of a film prior to heating. The film can be obtained, for example, by methods such as solution-casting or processing, spin-coating, pressing or molding.

In a preferred embodiment, the film is obtained by solution-casting or processing. Thus, it is preferred where a solution of the composition can be formed and solution processing is possible and also where the organic material is not stable in the melt. Preferred solvents for the compositions are non-aqueous solvents that are not generally miscible with water at room temperature. Thus, suitable solvents include, for example, toluene, xylene, chlorobenzene, chloroform and n-butanol.

The composition comprising an organic semiconducting material is heated to a temperature sufficient to cause melting.

In one embodiment, the composition is heated using a heating means such as an oven, an electric hotplate, heat guns, heated stamps, or irradiation, for example with infrared light or lasers. Preferably, the heating means comprises at least one heating plate. The composition is heated to a temperature at or above the melting point or glass transition temperature of the composition.

Preferably, the temperature to which the composition is heated is below the temperature at which substantial decomposition of the organic semiconducting material occurs i.e., the material is stable, as defined above.

Advantageously, the composition is heated to a temperature less than 200° C., preferably less than 100° C., most preferably less than 50° C. above the melting point or glass transition temperature of the composition. In contrast to smaller molecules such as rubrene, polymers may need a substantially higher temperature than the melting or glass transition temperature to become a fluid of convenient viscosity.

Generally, the melt is cooled after the heating step to a temperature ranging, for example, from 10° C. to 40° C. The term "cooling" is not restricted to active cooling only. Thus, the melt may be actively cooled using a cooling means or left or allowed to cool without the assistance of any cooling means.

The melt may be left or allowed to cool by, for example, removal of the melt from a heat source or by the removal of a heat source from the melt or by switching off a heat source that is controlled, for example, electrically. Cooling of the melt may also be achieved by using an active cooling means, such as a fan. The rate of cooling of the composition may be closely controlled in a preferred embodiment, for example, by a "temperature-controlled" hot stage.

In one embodiment, cooling of the melt is carried out at a rate of from about 0.01° C./min to about 1000° C./min, more preferably from about 1° C./min to about 100° C./min. In a preferred embodiment, the melt is exposed to a temperature gradient for controlling the grain size and molecular orientation of the melt-processed organic material.

Preferably, the composition has a melting point or glass transition temperature above about 50° C. In a preferred embodiment, the composition has a melting point or glass transition temperature of from 100° C. to 1000° C. The melting point or glass transition temperature of the composition in a particularly preferred embodiment is from 150° C. to 800° C., most preferably from 150° C. to 400° C.

In one embodiment, the melting point or glass transition temperature of the organic semiconducting material is above about 70° C. In a more preferred embodiment, the material has a melting point or glass transition temperature of from 70° C. to 1000° C. The melting point or glass transition temperature of the material in a particularly preferred embodiment is from 100° C. to 600° C., most preferably from 200° C. to 400° C.

Advantageously, the organic semiconducting material may have a melting point or glass transition temperature below the decomposition point of the material.

Preferably, the composition has a melting point or glass transition temperature lower than the melting point or glass transition temperature of the organic semiconducting material. It is preferred that the melting point or glass transition temperature of the composition is at least 10° C. lower than the melting point or glass transition temperature of the semiconducting material.

In one embodiment, the composition comprises a third substance that reduces the melting point or glass transition temperature of the composition below the melting point or glass transition temperature of the semiconducting material. The third substance may, for example, be a different organic semiconducting material, preferably present in an amount of 1 to 99, more preferably from 2 to 70 wt. % of the total composition. Preferably, the third substance does not reduce the mobility of the organic semiconducting material in the composition whose melting point or glass transition temperature is reduced. Typically, the third substance lowers the melting point or glass transition temperature of the semiconducting material by at least 10° C., more preferably from 20° C. to 50° C.

Suitable combinations of organic materials and third substances include semiconducting compounds from homologous series, such as, for example, rubrene/diphenylanthracene, rubrene/phenylnaphthalene, tetracene/naphthalene, tetracene/anthracene and sexythiophene/quatrthiophene. Preferred wt % ratios of the organic materials to third substance range from 10:1 to 1:10, more preferably from 5:1 to 1:5, most preferably from 2:1 to 1:2.

The third substance may optionally be removed after heating, for example by sublimation, evaporation or dissolution. In particular, the third substance can be removed before or after cooling the melt.

After cooling of the melt, the composition may be in the physical form of, for example, a film, a sheet, a thick section, an extrudate or a fiber. Preferably, the composition is at least partially crystalline.

In one embodiment, the device comprises the material in the form of a film. As used herein, "film" means a continuous piece of a substance having a high length to thickness ratio and a high width to thickness ratio.

More preferably the film is at least partially crystalline. With cooling of the melt, as defined above, a highly crystalline film of the organic material may be formed.

In a preferred embodiment, the melt-processed organic material is a polycrystalline material. It is preferred that the polycrystalline material has a grain size equal to or greater than the dimensions between contacts in a semiconductor device.

The thickness of the film may vary according to the device in which it is to be used and may also vary according to the composition which is used. The thickness of the film may be, for example, 10 μm or less. Preferably, the thickness of the film is from 100 nm to 1 μn, more preferably from 50 to 500 nm.

In one embodiment of the invention, the film is continuous. It is also preferred that the film has a substantially uniform thickness.

In one embodiment of the invention, the film is patterned by only heating parts of a pre-formed film to a temperature at or above the melting point or glass transition temperature to obtain semiconducting parts or "islands" in a glassy, insulating or poorly semiconducting matrix. This may be achieved, for instance by employing a heating tool containing surface relief structures, such as a stamp or by laser-writing. Patterning of a semiconductor in semiconductor devices is discussed in U.S. Pat. No. 6,403,397 to H. E. Katz and the contents of this document are incorporated herein by reference.

Advantageously, the organic semiconducting material comprises aryl and/or heteroaryl groups. Preferably, the organic semiconducting material comprises aryl groups.

It is also contemplated that the present invention provides, in an additional aspect, a method of forming a semiconducting device comprising an organic semiconducting material, which method comprises: heating a composition comprising the organic semiconducting material to a temperature at or above the melting point or glass transition temperature of the composition to form a melt; cooling the melt to a temperature below the melting point or glass transition temperature of the composition; and wherein the organic semiconducting material comprises aryl and/or heteroaryl groups and preferably any of the polycyclic ring compounds as defined herein.

The term "aryl" as used herein includes phenyl and polycyclic fused ring compounds which contain at least one fully aromatic ring, such as, for example, naphthalene, 1,2-dihydronaphthalene, anthracene and polyacenes such as naphthacenes, including rubrene, optionally substituted with one or more groups such as, for example, cyano, amino, fluorine, chlorine, bromine, iodine, nitro, phenyl, hydroxy, sulfide, thiol, $C_1$ to $C_{20}$ alkyl, $C_2$ to $C_{20}$ alkenyl, $C_2$ to $C_{20}$ alkynyl, ester (i.e., —$CO_2$—$R^a$ where $R^a$ is selected from: $C_{1-20}$ unsubstituted alkyl, alkenyl or alkynyl; and aralkyl as defined herein), alkyl ester (i.e. —$R^{b1}$—$CO_2$—$R^{a1}$ where $R^{a1}$ is as defined for $R^a$ and $R^{b1}$ is selected from: $C_{1-20}$ alkyl, $C_2$ to $C_{20}$ alkenyl, $C_2$ to $C_{20}$ alkynyl; and aralkyl as defined herein), $C_{1-20}$ alkoxy, amide (i.e., —$CONR^bR^c$ where $R^b$ and $R^c$ are independently selected from: hydrogen; $C_{1-20}$ unsubstituted alkyl, $C_2$ to $C_{20}$ alkenyl or $C_2$ to $C_{20}$ alkynyl; and aralkyl groups as defined herein) and alkynylaryl (i.e. —CC-aryl-$R^{c1}$ where $R^{c1}$ is selected from: hydrogen, $C_{1-20}$ unsubstituted alkyl, $C_2$ to $C_{20}$ alkenyl or $C_2$ to $C_{20}$ alkynyl; and aralkyl groups as defined herein).

The term "heteroaryl" as used herein refers to monocyclic and polycyclic fused or non-fused ring aromatic or non-aromatic containing compounds containing at least one heteroatom such as, for example, nitrogen, sulfur or oxygen or combinations thereof within any of the rings and where at least one of the rings is aromatic. The ring or rings comprising the heteroatom may be three, four, five, six, seven or eight membered. The term "heteroaryl" is intended to include compounds that comprise partially or fully saturated rings, in addition to aromatic rings. The heteroatom may be situated in the partially or fully saturated rings or in the aromatic ring.

The term "heteroaralkyl" as used herein refers to $C_1$ to $C_{20}$ alkyl substituted with heteroaryl (eg, pyrazolylmethyl).

The heteroaryl compounds may optionally be substituted with alkyl, alkaryl or aryl groups as defined above or with one or more other groups selected from, for example, cyano, amino, fluorine, chlorine, bromine, iodine, nitro, phenyl, hydroxy, sulfide, thiol, ester (i.e., —$CO_2$—$R^d$ where $R^d$ is selected from: $C_{1-6}$ unsubstituted alkyl, alkenyl or alkynyl; and aralkyl as defined herein), and amide (i.e., —$CONR^eR^f$ where $R^e$ and $R^f$ are independently selected from: hydrogen; $C_{1-6}$ unsubstituted alkyl, alkenyl or alkynyl; and aralkyl, groups as defined herein).

The term "alkyl" as used herein, includes straight chain and, for alkyl groups containing three or more carbon atoms, branched and also cycloalkyl groups. Examples of straight chain alkyl include methyl, ethyl, propyl, butyl, pentyl and hexyl. Examples of branched alkyl include isopropyl, isobutyl, and tert-butyl. Examples of cycloalkyl groups include cyclopropyl, cyclobutyl, cyclopentyl and cyclohexyl.

In the invention, preferred alkyl groups are those having from 1 to 20 carbon atoms, more preferably, from 2 to 15, most preferably from 4 to 12 carbon atoms. Where the alkyl group is methyl, it is preferred that this is substituted in the ortho- or meta-position of an aryl and/or heteroaryl group. For alkyl groups containing three or more carbon atoms, the branched structural isomers are preferred.

The alkyl groups may optionally be substituted with, for example, aryl (such as phenyl), and aralkyl groups and/or one or more groups such as, for example, cyano, amino, fluorine, chlorine, bromine, iodine, nitro, hydroxy, sulfide, thiol, ester (i.e., —$CO_2$—$R^g$ where $R^g$ is selected from: $C_{1-6}$ unsubstituted alkyl, alkenyl or alkynyl; and aralkyl or aryl, as defined herein), $C_{1-6}$ alkoxy and amide (i.e., —$CONR^hR^i$ where $R^h$ and $R^i$ are independently selected from: hydrogen; $C_{1-6}$ unsubstituted alkyl, alkenyl or alkynyl; and aryl, aralkyl). Alkyl groups may be substituted in the alkyl chain by one or more heteroatoms selected from O, S and NH.

The terms "alkenyl" and "alkynyl" are defined similarly to the term "alkyl" but the groups contain at least two carbon atoms and one or more, preferably one, carbon-carbon double or triple bonds, respectively.

The term "aralkyl" as used herein refers to $C_1$ to $C_{20}$ alkyl substituted with aryl (e.g., benzyl).

The term "alkylene" is defined similarly to the definition of the term "alkyl" but includes, for example, $C_2$ to $C_{20}$ groups and is a divalent species with radicals separated by two or more (e.g., from two to twelve) carbons linked in a chain. Preferably, the alkylene groups are straight chain groups. The alkylene groups are optionally substituted in or on the alkylene chain.

Preferred examples of organic semiconducting materials include polyacenes such as naphthacene, dibenzonaphthacene, tetrabenzonapthacene, pentacene, hexacene, heptacene, dibenzopentacene, tetrabenzopentacene, pyrene, dibenzopyrene, chrysene, perylene, coronene, terylene, ovalene, quoterylene and derivatives in which some of the carbon atoms of polyacenes are substituted with atoms such as N, S and O or with a functional group such as a carbonyl group or carboxyl group, for example, tetracarboxylic acid diimides such as naphthalene 1,4,5,8-tetracarboxylic diimide and anthracene tetracarboxylic acid diimides such as anthracene 2,3,6,7-tetracarboxylic acid diimides, fullerenes such as $C_{60}$, $C_{70}$, $C_{76}$, $C_{78}$ and $C_{84}$, carbon nanotubes such as SWNT and polycyclic condensation products further described in Japanese Patent Publication no. 11-195790.

Preferred materials are condensed polycyclic aromatic compounds such as naphthacene, dibenzonaphthacene, tetrabenzonapthacene, fullerenes, condensed cyclic tetracarboxylic acid diimides of condensed ring compounds, and metallophthalocyanines.

In one embodiment, the organic semiconducting material comprises a polycyclic fused ring system.

Preferably, the polycyclic fused ring system is optionally substituted with one or more groups selected from: aryl; alkynylaryl; $C_1$ to $C_{20}$ alkyl; $C_2$ to $C_{20}$ alkenyl; $C_2$ to $C_{20}$ alkynyl; $C_1$ to $C_{20}$ aralkyl; $C_1$ to $C_{20}$ alkoxy; and —$CO_2$—$R^{a2}$ where $R^{a2}$ is selected from: $C_1$ to $C_{20}$ unsubstituted alkyl, $C_2$ to $C_{20}$ alkenyl and $C_2$ to $C_{20}$ alkynyl, said one or more aryl and/or alkynylaryl and/or aralkyl groups being optionally substituted on the aromatic ring by one or more groups selected from: halo; phenyl; $C_1$ to $C_{20}$ alkyl; $C_2$ to $C_{20}$ alkenyl; $C_1$ to $C_{20}$ aralkyl; $C_1$ to $C_{20}$ alkoxy; and —$CO_2$—$R^{a3}$ where $R^{a3}$ is selected from: $C_1$ to $C_{20}$ unsubstituted alkyl, $C_2$ to $C_{20}$ alkenyl and $C_2$ to $C_{20}$ alkynyl.

Further optional substituents for the polycyclic fused ring system include cyano, amino, fluorine, chlorine, bromine, iodine, nitro, hydroxy, sulfide, thiol and amide (i.e., —$CONR^kR^l$ where $R^k$ and $R^l$ are independently selected from: hydrogen; $C_{1-6}$ unsubstituted alkyl, alkenyl or alkynyl; and aryl, aralkyl).

In one embodiment of the invention, the organic semiconductor material comprises a polycyclic fused ring system containing from two to twelve, more preferably from four to ten, most preferably from six to eight fully aromatic rings wherein the aromatic rings are optionally substituted as described herein. Preferably, the aromatic rings are $C_6$ aromatic rings e.g., phenyl rings.

In one embodiment, the organic semiconductor material comprises a polycyclic fused ring system having the following formula:

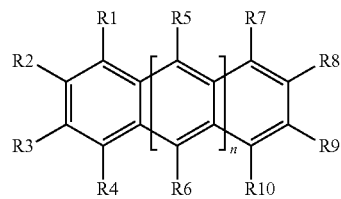

wherein n is an integer from 0 to 10, preferably from 2 to 6; and $R^1$, $R^2$, $R^3$, $R^4$, $R^5$, $R^6$, $R^7$, $R^8$, $R^9$, $R^{10}$ are independently selected from the group consisting of: hydrogen; aryl; alkynylaryl; $C_1$ to $C_{20}$ alkyl; $C_1$ to $C_{20}$ unsubstituted alkyl; $C_2$ to $C_{20}$ alkenyl; $C_2$ to $C_{20}$ alkynyl; $C_1$ to $C_{20}$ aralkyl; $C_1$ to $C_{20}$ alkoxy; and —$CO_2$—$R^m$ where $R^m$ is selected from: $C_1$ to $C_{20}$ unsubstituted alkyl, $C_2$ to $C_{20}$ alkenyl, $C_2$ to $C_{20}$ alkynyl, $C_2$ to $C_{20}$ aralkyl or $C_1$ to $C_{20}$ alkoxy.

Additionally, where the organic material is a polymer (other than a polycene) at least two of $R^1$, $R^2$, $R^3$, $R^4$, $R^5$, $R^6$, $R^7$, $R^8$, $R^9$ and $R^{10}$ on different molecules may be independently linked to each other, either directly or preferably via a spacer group, for example, an alkylene group, between different molecules to form the polymer.

Alternatively, or in addition, any one of $R^1$, $R^2$, $R^3$, $R^4$, $R^5$, $R^6$, $R^7$, $R^8$, $R^9$ and $R^{10}$ may be independently linked, either directly or preferably via a spacer group, for example, an alkylene group, to a polymeric chain to form the polymer, before during or after the polymeric chain itself is formed.

Preferably, $R^5$ and $R^6$ are selected from hydrogen and aryl, optionally substituted with one or more $C_1$ to $C_{20}$, preferably $C_2$ to $C_{10}$, alkyl groups. It is particularly preferred that the aryl groups are phenyl groups.

In one embodiment, $R^1$, $R^2$, $R^3$, $R^4$, $R^7$, $R^8$, $R^9$ and $R_{10}$ are all hydrogen and $R^5$ and $R^6$ are selected from hydrogen, aryl and alkynylaryl, wherein the aryl and alkynylaryl groups are optionally substituted with one or more $C_1$ to $C_{20}$, preferably $C_2$ to $C_{10}$, alkyl groups. Preferably $R^5$ and $R^6$ are aryl and/or or $C_2$ to $C_4$ alkynylaryl. It is particularly preferred that the aryl groups are phenyl groups. When n is greater than 1, each set of $R^5$ and $R^6$ may be the same or different.

Advantageously, the organic semiconducting material is a polycyclic fused ring compound selected from: a diphenyl-anthracene, optionally substituted with one or more $C_1$ to $C_{20}$ alkyl groups, preferably at any of the non-fused aromatic ring positions; a hexaphenyl-naphthacene optionally substituted with one or more $C_1$ to $C_{20}$ alkyl groups, preferably at any of the non-fused aromatic ring positions; a tetraphenyl-naphthacene, optionally substituted with one or more $C_1$ to $C_{20}$ alkyl groups, preferably at any of the non-fused aromatic ring positions; a bis(phenylethynyl)naphthacene optionally substituted with one or more $C_1$ to $C_{20}$ alkyl groups, preferably at any of the non-fused aromatic ring positions; a hexaphenyl-pentacene optionally substituted with one or more $C_1$ to $C_{20}$ alkyl groups, preferably at any of the non-fused aromatic ring positions; and a diphenyl-naphthacene, optionally substituted with one or more $C_1$ to $C_{20}$ alkyl groups, preferably at any of the non-fused aromatic ring positions. In a preferred embodiment, the alkyl groups are $C_4$ to $C_{12}$ alkyl groups.

It is preferred that the polycyclic ring compound is substituted at from one to four positions, more preferably from two to three positions. It is more preferred that the positions are in the non-fused aromatic rings.

In a particularly preferred embodiment, the organic semiconducting material is selected from 5,6,11,12-tetraphenyl-naphthacene (I) (rubrene) and 5,12-diphenyl-naphthacene (II). These compounds may be optionally substituted with one or more $C_1$ to $C_{20}$, preferably $C_4$ to $C_{12}$ alkyl groups at any of the non-fused aromatic ring positions.

In one embodiment of the invention, the organic semiconducting material is 5,6,11,12-tetraphenyl-naphthacene (rubrene) (I). This compound can be obtained commercially from, for example, the Aldrich chemical company. Alternatively rubrene can be synthesised according to the method described in F. H. Allen, L. Gilman (J. Am. Chem. Soc. 58 (1936) 937). The synthetic method described in Allen et al can be modified to provide the derivatives described above by, for example, using suitably substituted aryl compounds instead of unsubstituted aryl compounds.

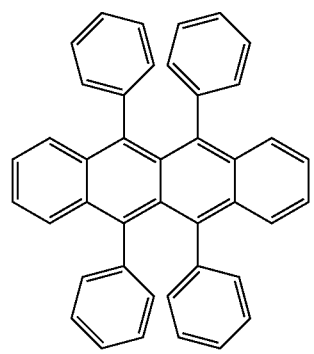

I

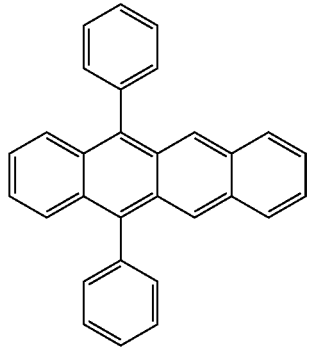

II

Examples of preferred substituted compounds are shown in formulae (III) and (IV) below.

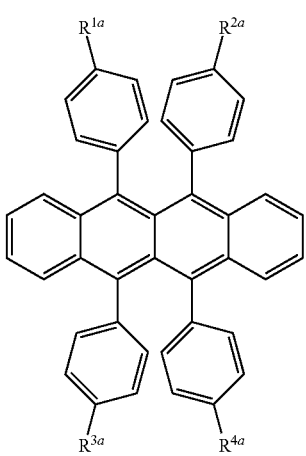

III

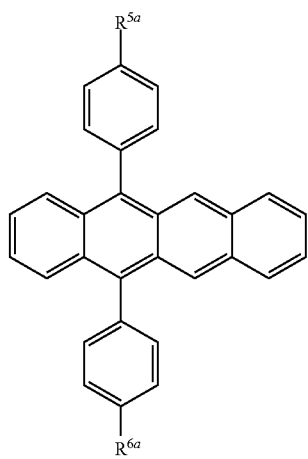

IV $R^{1a}$, $R^{2a}$, $R^{3a}$, $R^{4a}$, $R^{5a}$ and $R^{6a}$ are independently selected from hydrogen or $C_1$ to $C_{20}$ alkyl groups. Preferably, the alkyl groups are $C_2$ to $C_{15}$ alkyl groups, more preferably, $C_4$ to $C_{12}$.

In another embodiment, the organic semiconducting material is a polymer.

Where the organic semiconducting material is a polymer, the polycyclic fused ring system may be present in the backbone of the polymer and/or on the polymer e.g., as a side chain. An example of a polymer containing a polycyclic fused ring system in the backbone is shown below.

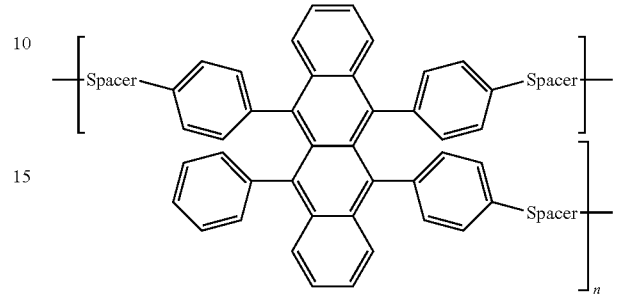

The spacer group can be any linking group known to the person skilled in the art and n is an integer, for example, from 1 to 10,000. An example of a suitable spacer group is a $C_1$ to $C_{20}$ alkylene group.

The polycyclic fused ring system may, for example, be present in the side chain of a polymer as shown in the figure below.

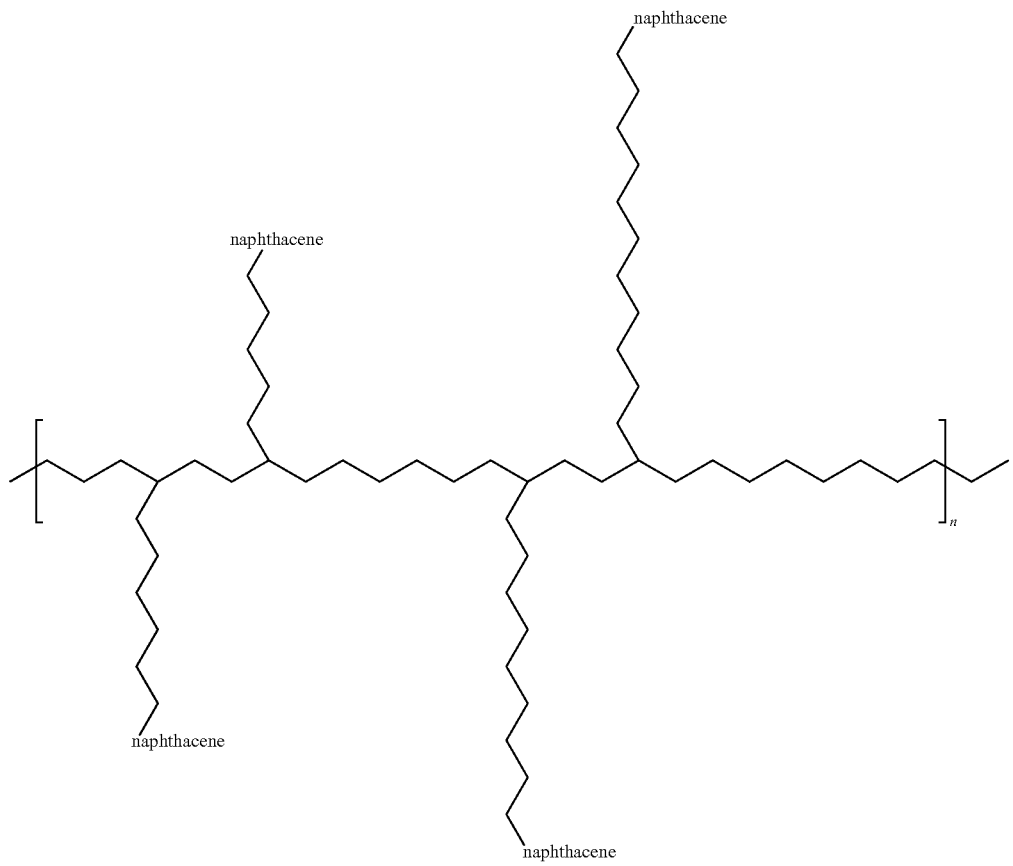

Particularly preferred polymers are those having a melting point or glass transition temperature of from 100° C. to 1000° C., more preferably from 200° C. to 500° C.

In one embodiment, the method of forming a semiconducting device comprises the step of applying the composition comprising the organic semiconducting material onto a substrate or assembly, preferably prior to heating the composition. The substrate or assembly preferably comprises a material from which the melt is not removed following processing of the composition.

In a preferred embodiment, the substrate or assembly forms part of a semiconducting device, such as a field-effect transistor.

Where the substrate or assembly forms part of a device, it is preferred that the substrate or assembly comprises a first electrode, an insulator and a second set of electrodes. Suitable device configurations are known in the art. In particular, suitable device configurations are described in U.S. Pat. No. 6,403,397 to Katz.

The insulator can be any suitable material. Examples are described in U.S. Pat. No. 6,403,397 and include silicon oxides, other oxides such as glass and alumina, polymeric materials such as poly(imide), polyesters such as Mylar® and resins and the like.

The first and second electrodes can be any suitable material known to the person skilled in the art that allows the passage of electrons through it. Preferably the electrode material is a noble metal such as gold, palladium, platinum or silver. A preferred metal is gold. Alternatively, conducting polymers such as polyanilin or poly(ethylendioxithiophenes) (PEDOT) can be used. In a particularly preferred embodiment, the electrodes are lithographically structured gold.

In the method of forming a field-effect transistor (FET) according to the present invention, the assembly comprises a first electrode, an insulator and a second set of electrodes and these may be as specified above. Optionally, the FET may comprise a substrate.

The formation of the FET may take place under the conditions specified above for forming a semiconducting device.

In a particularly preferred embodiment of the invention, the formation of the FET takes place in the presence of air and/or light, preferably both air at ambient pressure and light. This avoids the need for specialised equipment, such as glove boxes, and the need for an inert atmosphere.

In one embodiment, the first electrode forms a layer on which the insulator is placed or formed. Preferably, the insulator forms a second adjacent layer on which the second set of electrodes are placed or formed. Typically, the second set comprises two electrodes. The second set of electrodes may be spaced apart on the insulator and leave part of the surface of the insulator exposed. The composition may be placed over the second set of electrodes and insulator, preferably prior to heating. Suitable configurations for the device are indicated in U.S. Pat. No. 6,403,397.

Both the composition comprising an organic semiconducting material and the organic semiconducting material itself may be as specified above in relation to the method of forming a semiconducting device.

In one embodiment, the composition is in the form of a powder prior to heating that is placed on and between the electrodes and insulator, preferably prior to heating of the assembly and/or composition.

In a preferred embodiment, the composition is in the form of a film prior to heating. Preferably the film is placed on and between the second set of electrodes and insulator before heating of the assembly and/or composition.

Advantageously, the FET is formed with either a top contact geometry or a bottom contact geometry as described in U.S. Pat. No. 6,403,397. Preferably, the FET is formed with a top contact geometry.

Where the insulator is a layer as part of a layered stack structure and is adjacent to a first electrode, it is preferred that the composition covers the exposed top surface of the insulator substantially parallel to the first electrode.

Preferably, the assembly and/or composition is heated to a temperature at or above its melting point or glass transition temperature by a heating means. The heating means may suitably comprise at least one heating plate or a heating means as specified above.

In one embodiment of the invention, the first electrode is in direct contact with a lower heating plate. Optionally, an upper heating plate may also be used in addition to the lower heating plate.

In one embodiment, a first substance or object capable of inhibiting and/or preventing dewetting is adjacent the composition, preferably between the composition and any heat source, such as an upper heating plate, preferably prior to heating the assembly and/or composition.

The first substance or object capable of inhibiting and/or preventing dewetting, by placing it adjacent or above the composition, may be as defined above. Thus, in a preferred embodiment, the substance or object capable of inhibiting and/or preventing dewetting may be in the form of a layer that is placed on the top surface of the composition layer i.e., the surface opposite that in contact with a substrate or assembly.

Alternatively, the composition further comprises an agent capable of inhibiting and/or preventing dewetting. The agent may be as defined above. Thus, in a preferred embodiment, the agent capable of inhibiting and/or preventing dewetting may increase the viscosity of the composition and/or melt or increase the affinity of the composition to the substrate, or both.

Cooling of the assembly and/or melt may be carried out as described above.

In one embodiment, the assembly and melt may be removed from a hot-plate following the heating step and allowed to cool to a temperature below the melting point or glass transition temperature of the composition. Alternatively, the assembly and melt may be retained on the hot-plate and the temperature of the hot-plate may be reduced to a temperature below the melting point or glass transition temperature of the composition.

In the device, the solidified melt (containing the composition) may act as a switchable, i.e., on-off, connection between the second set of electrodes to allow current to flow through the device. The solidified melt can preferably act as, for example, a semiconductor upon the application of a sufficient gate voltage.

In a preferred embodiment, a continuous crystalline film is formed from the melt that covers the surfaces of the second set of electrodes exposed to the melt and the top surface of the insulator adjacent to the melt. The thickness of the film may be as specified above.

In a particularly preferred embodiment, a continuous crystalline film is formed from the melt only where it covers the active area of the semiconductor device, for example in the channel, i.e., between the source/drain electrodes in field-effect transistors. In one embodiment, the crystalline areas may be embedded in an insulating matrix such as an uncrystallised film.

Optionally, the semiconducting device and FET transistor formed according to the present invention may be subjected to an annealing treatment following its formation.

Preferably, annealing is carried out for a period of from 1 second to 20 hours, more preferably from 1 minute to 15 hours at a temperature of from 5° C. to 200° C. below the melting temperature or glass transition temperature of the composition, more preferably at a temperature of from 20° C. to 80° C. below the melting temperature or glass transition temperature of the composition. The pressure under which annealing takes place may suitably be from $10^{-8}$ mbar to 1 bar, more preferably from $10^{-5}$ mbar to $10^{-3}$ mbar or at higher pressures such as greater than $10^5$ Pa.

Annealing may increase the ON-OFF ratios of the FET.

The invention will now be illustrated by the following specific embodiment. This embodiment is not intended to limit the scope of protection for the invention.

Figure 1:
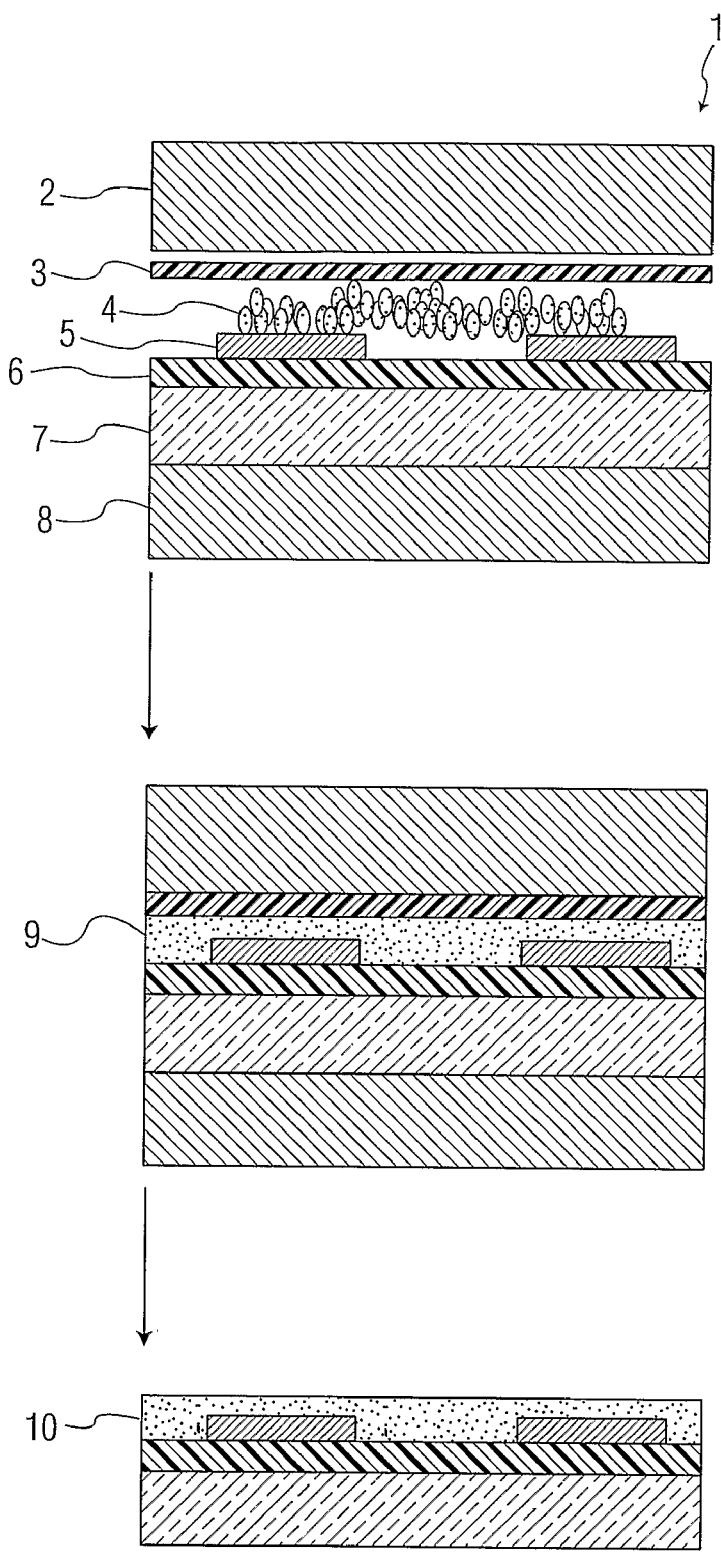
FIG. 1 is a schematic representation showing the formation of an organic field-effect transistor comprising an organic semiconductor material in the form of a thin film according to a preferred embodiment of the present invention.

The schematic diagram in FIG. 1 shows a stack (1). In the stack (1) a composition comprising an organic semiconducting material (4), preferably consisting of rubrene powder or film, is placed onto an assembly comprising an insulator (6), preferably consisting of $SiO_2$, source/drain contacts (5), preferably consisting of lithographically structured gold electrodes and a doped material, preferably consisting of $n^{++}$ doped silicon (7).

Optionally, a layer (3), comprising, for example, PTFE, poly(imide) (P1), mica or silicon, is placed on top of the composition (4). Preferably, the layer (3) can inhibit or prevent dewetting of the composition (4). The layer (3) may also help to produce homogenous distribution of the melt onto the source/drain contacts (5) and insulator (6). Alternatively, an agent, such as high molecular weight polystyrene, for example, having a molecular weight ($M_w$) of about 30,000,000 g/mol is added to the composition to increase the viscosity of the melt, which decreases dewetting effects.

The assembly, composition (4) and optional top layer (3), is preferably placed between a heating means comprising a lower heated plate (8) and, optionally, an upper heated plate (2). The assembly and composition (4) is heated at a temperature at or above the melting point or glass transition temperature of the composition (about 350° C. for rubrene), preferably in air and light, until all of the composition (9) is melted between the source/drain contacts (5) (shown in FIG. 1).

In order to form the FET, the assembly and melted composition (9) can be removed from the hot-plate (2,8) and allowed to cool to a temperature below the melting point or glass transition temperature of the composition (4). Alternatively, the hot-plate (2,8) itself is cooled to a temperature below the melting point or glass transition temperature of the composition without removal of the FET.

FIG. 1 shows the FET removed from the hot plates. The top layer (3) has been removed before cooling of the melt. Preferably, the melt-processed composition is in the form of an at least partially crystalline film (10).

Figure 2:
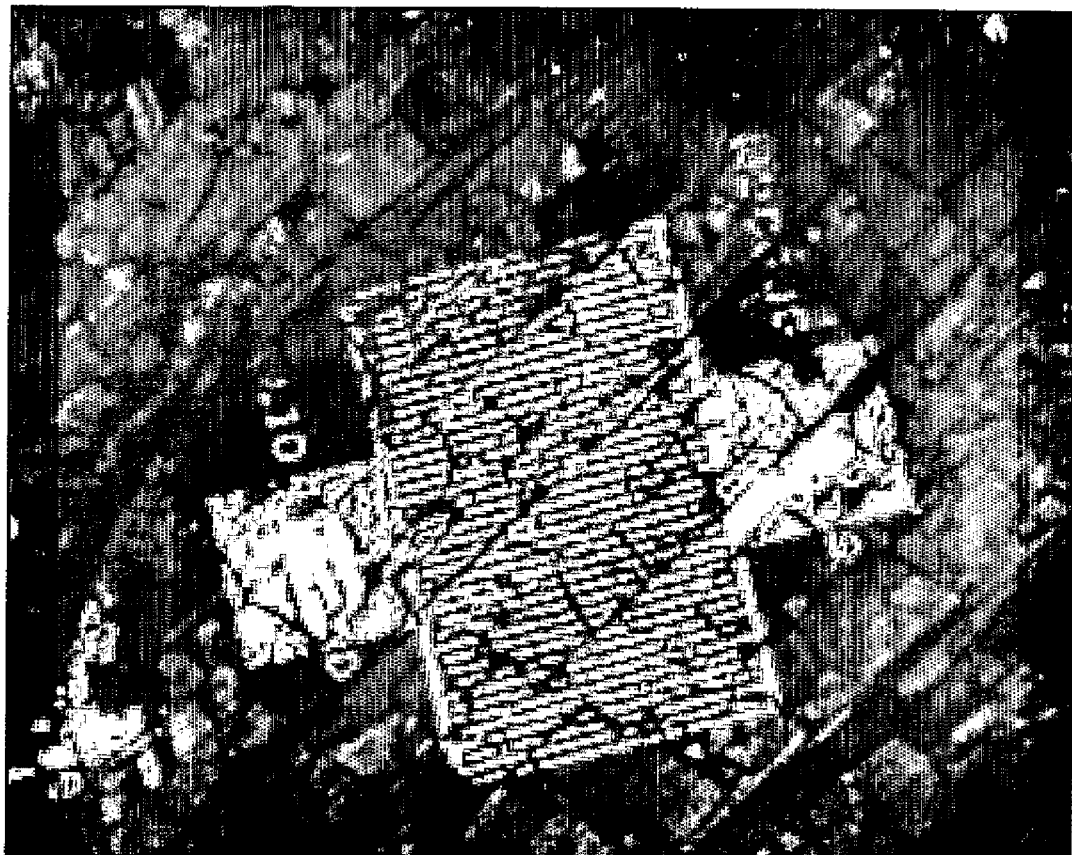
FIG. 2 shows the birefringence in polarized optical microscopy of a highly crystalline film produced according to a preferred embodiment of the present invention. An amorphous film would not show any birefringence at all and would therefore appear dark.
Figure 2:
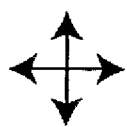

In one embodiment (where the composition subjected to melt-processing consists of rubrene), a highly crystalline film was obtained on the FET. This was determined by the birefringence of the film in polarized optical microscopy. This is shown in FIG. 2. Amorphous films do not show any birefringence.

The FET fabricated according to the above method was tested according to established protocols as described in, for example, U.S. Pat. No. 6,403,397.

As shown in FIG. 5, the FET according to one embodiment of the invention (where the composition subjected to melt-processing consists of rubrene) displays high mobilities of up to 0.01-0.05 $cm^2/Vs$, despite considerable contact resistance, and ON-OFF ratios of at least $10^3$.

The present invention will now be illustrated by the following specific examples, which are not intended to limit the scope of protection for the invention.

EXAMPLE 1

Formation of an FET Using a Dewetting Agent

A solution of a 1:1 mix (in weight percent, wt. %) of rubrene and diphenylanthracene in xylene (all chemicals obtained from Aldrich) was prepared. The solution contained 50 mg each of rubrene and diphenylanthracene per 1 ml of xylene. To the solution 10 wt. % (with respect to the mix) of high-molecular weight polystyrene (PS; weight average molecular weight, $M_w$~30,000,000 g/mol from Polysciences) was added to prevent dewetting from substrates.

An FET was formed by solution casting the above solution onto standard test substrates. Standard test substrates consist of a highly-doped Si layer ("the gate") and an about 100 nm thick $SiO_2$ layer ("the dielectric") on top of which lithographically-defined Au had been applied ("the source/drain electrodes"). The solution-casting process was often performed at elevated temperatures (~160° C.) to evaporate the solvent rapidly. This leads to a continuous glassy rubrene/diphenylanthracene/PS film.

The whole assembly (substrate and composition) was heated to ~235° C., and, subsequently cooled at a rate of ~10° C./min to crystallize the rubrene/diphenylanthracene/PS layer. At 235° C. about 80% of the rubrene/diphenylanthracene mixture is in the liquid state (see the phase diagram in FIG. 4). Therefore polystyrene (an insulator) has to be added to increase the viscosity of the semiconducting composition such that no dewetting occurs during the crystallisation step.

The mobility of the device was calculated from source-drain currents obtained at various gate voltages in the saturation regime according to methods known in the art.

EXAMPLE 2

Formation of an FET Using a Dewetting Auxiliary Film

The experiment according to Example 1 was repeated. However, instead of adding high-molecular weight polystyrene to the mixture of rubrene and diphenylanthracene, a mica or polytetrafluorethylene auxiliary-film is applied onto a glassy rubrene/diphenylanthracene layer to provide homogeneous distribution of the composition at 235° C. and thus prevent dewetting.

The auxiliary film can be removed before or after cooling the assembly.

EXAMPLE 3

Formation of an FET Using Solution-Processing

A solution of 5,12-bis-(phenylethynyl)naphthacene in xylene was prepared at a concentration of 5 mg/ml. About 10 wt. % of the 5,12-bis-(phenylethynyl)naphthacene of high-molecular weight polystyrene (PS; weight average molecular weight ($M_w$) about 6,000,000 g/mol) was added to the solution. An FET was formed by solution-casting or processing according to methods known in the art. This method is particularly preferred for organic materials that contain carbon-carbon triple bonds in the side chains.

The mobility of the devices of Examples 1 to 3 were calculated from source-drain currents obtained at various gate voltages in the saturation regime according to methods known in the art.

FETs according to Example 3 displayed field-effect mobilities of $5 \times 10^{-4}$ cm$^2$/Vs.

The invention claimed is:

1. A method of forming a semiconducting device comprising an organic semiconducting material, the method comprising:
   heating a composition comprising the organic semiconducting material to a temperature at or above the melting point or a glass transition temperature of the composition to form a melt; and
   cooling the melt to a temperature below the melting point or glass transition temperature of the composition;
   wherein the composition further comprises an agent and an additional substance, the agent capable of inhibiting or preventing dewetting, and the additional substance provided in an amount capable of preventing initial crystallization of the composition and reducing the melting point or glass transition temperature of the composition below the melting point or glass transition temperature of the organic semiconducting material, wherein the additional substance comprises naphthalene, phenyl-naphthalene, anthrance, or diphenylanthrance.

2. The method of claim 1, wherein the agent increases the viscosity of the composition and/or melt.

3. The method of claim 1, wherein the agent increases the affinity of the composition and/or melt to a substrate.

4. The method of claim 1, wherein the composition comprising the organic semiconducting material is heated in the presence of air and/or light.

5. The method of claim 1, wherein the composition is in the form of a powder prior to heating.

6. The method of claim 1, wherein the composition is in the form of a film prior to heating.

7. The method of claim 1, wherein the melting point or glass transition temperature of the composition is from 100° C. to 1000° C.

8. The method of claim 1, wherein the melting point or glass transition temperature of the composition is below a decomposition point of the organic semiconducting material.

9. The method of claim 1, wherein the semiconducting device comprises the organic semiconducting material in the form of a film.

10. The method of claim 9, wherein the film is at least partially crystalline.

11. The method of claim 1, wherein the organic semiconducting material comprises a polycyclic fused ring system.

12. The method of claim 11, polycyclic fused ring system is optionally substituted with one or more groups selected from: aryl; alkynylaryl; $C_1$ to $C_{20}$ alkyl; $C_2$ to $C_{20}$ alkenyl; $C_2$ to $C_{20}$ alkynyl; $C_1$ to $C_{20}$ aralkyl; $C_1$ to $C_{20}$ alkoxy; and —$CO_2$—$R^{a2}$ where $R^{a2}$ is selected from: $C_1$ to $C_{20}$ unsubstituted alkyl, $C_2$ to $C_{20}$ alkenyl and $C_2$ to $C_{20}$ alkynyl, said one or more aryl and/or alkynylaryl and/or aralkyl groups being optionally substituted on the aromatic ring by one or more groups selected from: halo; phenyl; $C_1$ to $C_{20}$ alkyl; $C_2$ to $C_{20}$ alkenyl; $C_2$ to $C_{20}$ alkynyl; $C_1$ to $C_{20}$ aralkyl; $C_1$ to $C_{20}$ alkoxy; and —$CO_2$—$R^{a3}$ where $R^{a1}$ is selected from: $C_1$ to $C_{20}$ unsubstituted alkyl, $C_2$ to $C_{20}$ alkenyl and $C_2$ to $C_{20}$ alkynyl.

13. The method of claim 11, wherein the organic semiconducting material is a polycyclic fused ring compound selected from a tetraphenyl-naphthacene, optionally substituted with one or more $C_1$ to $C_{20}$ alkyl groups, and a diphenyl-naphthacene, optionally substituted with one or more $C_1$ to $C_{20}$ alkyl groups.

14. The method of claim 1, wherein the organic semiconducting material is rubrene.

15. The method of claim 1, wherein the organic semiconducting material is a polymer.

16. The method of claim 1, further comprising the step of applying the composition comprising the organic semiconducting material onto a substrate or assembly.

17. The method of claim 16, wherein the substrate or assembly comprises an insulator, a first electrode and a second set of electrodes.

18. A method of forming a semiconducting device comprising an organic semiconducting material, which method comprises:
   preparing a solution of a composition comprising the organic semiconducting material in a solvent wherein the composition further comprises an agent and an additional substance, the agent capable of inhibiting and/or preventing dewetting, and the additional substance provided in an amount capable of preventing initial crystallization of the composition and reducing the melting point or glass transition temperature of the composition below the melting point or glass transition temperature of the organic semiconducting material, wherein the additional substance comprises naphthalene, phenyl-naphthalene, anthrance, or diphenylanthrance; and
   applying the composition to form semiconducting parts of the semiconducting device.

19. The method of claim 18, wherein the composition comprising the organic semiconducting material is heated in the presence of air and/or light.

20. The method of claim 19, wherein the composition is in the form of a powder prior to heating.

21. The method of claim 19, wherein the composition is in the form of a film prior to heating.

22. The method of claim 18, wherein the melting point or glass transition temperature of the composition is from 100° C. to 1000° C.

23. The method of claim 18, wherein the device comprises the material in the form of a film.

24. The method of claim 23, wherein the film is at least partially crystalline.

25. The method of claim 18, wherein the organic semiconducting material comprises a polycyclic fused ring system.

26. The method of claim 18, further comprising the step of applying the composition comprising the organic semiconducting material onto a substrate or assembly.

27. The method of claim 26, wherein the substrate or assembly comprises an insulator, a first electrode and a second set of electrodes.

28. A device comprising an organic semiconducting material obtainable by the method of claim 1.

29. A device according to claim 28, which is a field-effect transistor.

30. A method of forming a field-effect transistor comprising:
   forming an assembly comprising a first electrode, an insulator, a second set of electrodes and optionally a substrate;
   placing a composition comprising an organic semiconducting material onto the assembly;
   heating the assembly and/or composition comprising the organic semiconducting material to a temperature at or above the melting point or glass transition temperature of the composition to form a melt;

cooling the melt to a temperature below the melting point or glass transition temperature of the composition;

wherein the composition further comprises an agent and an additional substance, the agent for inhibiting and/or preventing dewetting, and the additional substance provided in an amount capable of preventing initial crystallization of the composition and reducing the melting point or glass transition temperature of the composition below the melting point or glass transition temperature of the organic semiconducting material, wherein the additional substance comprises naphthalene, phenylnaphthalene, anthrance, or diphenylanthrance.

31. The method of claim 1, wherein the additional substance is a different organic material than the organic material of the composition.

32. The method of claim 31, wherein the additional substance is 0.01 weight percent to 1 weight percent of the total composition.

33. The method of claim 1, wherein the additional substance is removed after heating or cooling the melt.

34. The method of claim 18, wherein the additional substance is a different organic material than the organic material of the composition.

35. The method of claim 34, wherein the additional substance is 0.01 weight percent to 1 weight percent of the total composition.

36. The method of claim 18, wherein the additional substance is removed after heating or cooling the melt.

37. The method of claim 30, wherein the additional substance is a different organic material than the organic material of the composition.

38. The method of claim 37, wherein the additional substance is 0.01 weight percent to 1 weight percent of the total composition.

39. The method of claim 30, wherein the additional substance is removed after heating or cooling the melt.

* * * * *